United States Patent
Xu et al.

(10) Patent No.: US 9,726,724 B2
(45) Date of Patent: Aug. 8, 2017

(54) ON-CHIP CURRENT TEST CIRCUIT

(71) Applicants: Xiuqiang Xu, Suzhou (CN); Yin Guo, Tianjin (CN); Shayan Zhang, Cedar Park, TX (US); Wanggen Zhang, Suzhou (CN); Xu Zhang, Tianjin (CN); Yizhong Zhang, Suzhou (CN)

(72) Inventors: Xiuqiang Xu, Suzhou (CN); Yin Guo, Tianjin (CN); Shayan Zhang, Cedar Park, TX (US); Wanggen Zhang, Suzhou (CN); Xu Zhang, Tianjin (CN); Yizhong Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 436 days.

(21) Appl. No.: 14/554,056

(22) Filed: Nov. 26, 2014

(65) Prior Publication Data
US 2015/0323590 A1     Nov. 12, 2015

(30) Foreign Application Priority Data

May 6, 2014     (CN) .......................... 2014 1 0187126

(51) Int. Cl.
*G01R 31/26*     (2014.01)
*G01R 31/3187*     (2006.01)
*G01R 31/28*     (2006.01)

(52) U.S. Cl.
CPC ..... *G01R 31/3187* (2013.01); *G01R 31/2886* (2013.01)

(58) Field of Classification Search
CPC  G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 6,031,777 A | 2/2000 | Chan | |
| 7,250,783 B2 | 7/2007 | Hsu et al. | |
| 7,430,700 B2 | 9/2008 | Yacobucci | |
| 8,473,879 B2 | 6/2013 | Joshi | |
| 2003/0172332 A1* | 9/2003 | Rearick | G01R 31/3004 714/724 |
| 2005/0034041 A1* | 2/2005 | Casarsa | G01R 31/3004 714/733 |

OTHER PUBLICATIONS

Stefan Rusu et al., "Ivytown: A 22nm 15-Core Enterprise Xeon® Processor Family", IEEE International Solid-State Circuits Conference (ISSCC), Feb. 10, 2014.

* cited by examiner

*Primary Examiner* — Tung X Nguyen
(74) *Attorney, Agent, or Firm* — Charles E. Bergere

(57) ABSTRACT

An integrated circuit that includes a processor also has an on-chip current test circuit that indirectly measures quiescent current in the processor. A supply voltage pin of the integrated circuit receives a supply voltage from an external test unit to provide power to the processor. The on-chip test circuit measures a voltage change across the processor during a predetermined test period T when the processor is isolated from the supply voltage and the clock signal is stopped. The voltage change provides an indication of quiescent current corresponding to the processor.

19 Claims, 5 Drawing Sheets

ON-CHIP CURRENT TEST CIRCUIT

BACKGROUND OF THE INVENTION

The present invention relates generally to an integrated circuit having an on-chip current test circuit and, more particularly, to an integrated circuit with an on-chip test circuit for testing quiescent current.

As processors evolve, the number of transistors per unit area of the integrated circuit doubles approximately every two years (Moore's Law), which means that processors are shrinking. As processors shrink, leakage current becomes more significant and less predictable, which can make it difficult when testing integrated circuits to discriminate between properly operating circuitry with naturally high leakage current and defective circuitry that should have naturally low leakage current, but in fact has high leakage due to a fabrication defect.

One known technique for testing integrated circuits for manufacturing faults is Iddq testing, which measures the supply current (also called "quiescent current"), Idd, when the circuit is not switching (i.e., is unclocked) and the inputs are held at substantially constant values.

An alternative technique for testing integrated circuits is scan testing, which involves connecting circuit elements like flip-flops or latches into chains (replacing the latches/flip-flops by scan cells) and supplying test vectors, generated by Automatic Test Pattern Generation (ATPG) software, to the system using a test controller via a test interface. The states of the device under test can then be controlled and observed, by reading digital pins, to detect manufacturing defects. Generation of the test patterns requires a detailed knowledge of the underlying integrated circuit design and due to design and logic layouts there are typically areas of an integrated circuit that cannot be tested via scan testing, which can lead to an integrated circuit passing production tests but failing in customer applications.

Iddq testing is useful because it allows an integrated circuit to be checked for numerous possible faults simply by measuring the leakage current. A small set of test vectors is required to perform the Iddq test because exposing a defect via leakage current can depend upon whether gates are set to 0 or 1 at the time the measurement is made. Iddq tests allow for simple test generation due to a small set of test vectors being required relative to scan testing and can be effective in identifying a range of circuit defects with a low circuit area and design time overhead.

Iddq testing is conventionally performed using an ammeter and expensive automatic test equipment. There is a problem with Iddq testing in that it requires current measurements, which typically involve waiting for a long time (relative to the time taken to read digital pins in scan testing) to let the integrated circuit enter into a quiescent state and the Idd current settle before performing the measurements. This current-settling time can also give rise to test inaccuracy in test results due to noise. Thus, it would be advantageous to have an efficient way to perform Iddq testing.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
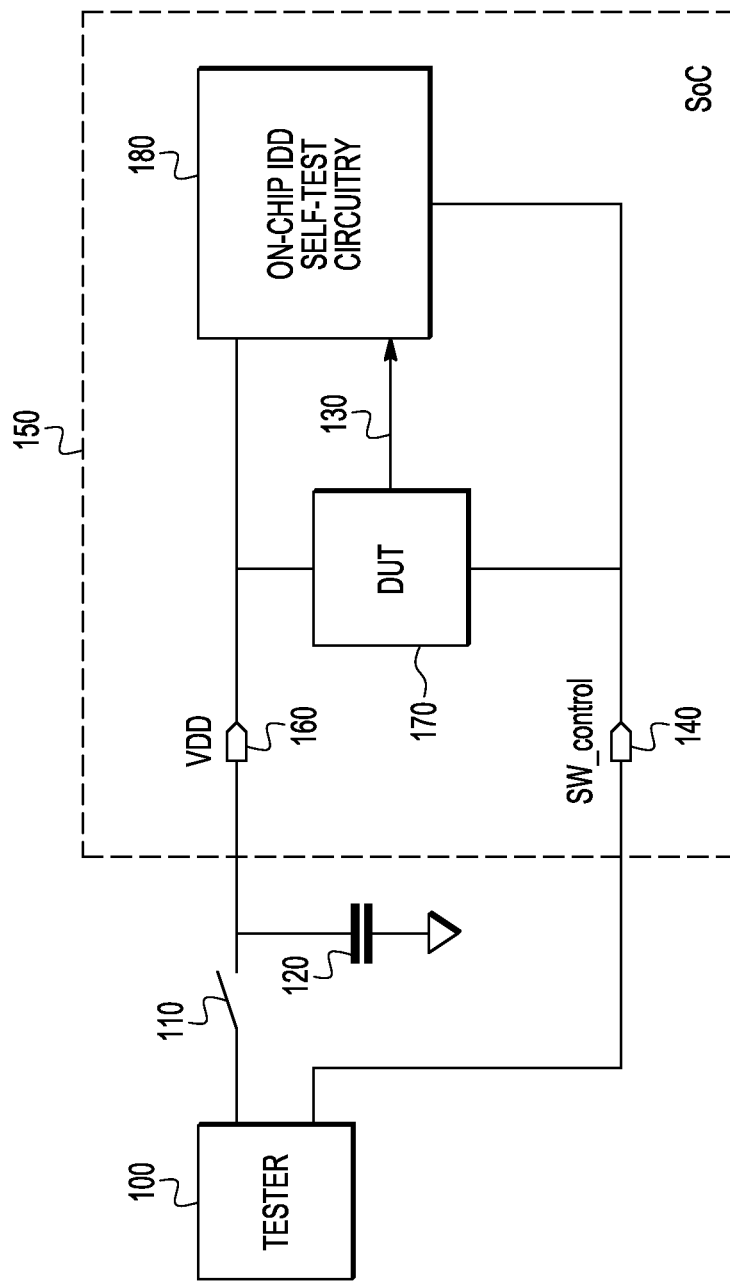
FIG. 1 is a schematic block diagram of a test system for performing quiescent current measurement on an integrated circuit.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an integrated circuit including a supply voltage input pin configured for connection to an external test unit to receive a supply voltage, processing circuitry configured to perform processing operations controlled by a clock signal and powered by the supply voltage, and an on-chip test circuit for testing operation of the processing circuitry. The on-chip test circuit is configured to measure a voltage change across the processing circuitry during a predetermined test period T when the processing circuitry is isolated from the supply voltage and the clock signal is stopped. The voltage change provides an indication of quiescent current corresponding to the processing circuitry.

In another embodiment, the present invention provides a method of testing an integrated circuit that has processing circuitry configured to perform processing operations controlled by a clock signal and powered by a supply voltage. The method comprises connecting the supply voltage to the integrated circuit, connecting the supply voltage to an on-chip test capacitor, placing the processing circuitry in a stop mode and isolating the processing circuitry from the supply voltage, and waiting a predetermined test period T, holding charge stored in the on-chip test capacitor of the integrated circuit. The method also includes disconnecting the on-chip test capacitor from the supply voltage of the processing circuitry, re-connecting the supply voltage to the processing circuitry, and measuring a voltage change across the processing circuitry during the test period T based upon the stored charge in the on-chip test capacitor.

In yet another embodiment, the present invention provides an integrated circuit (IC) including a Device Under Test (DUT) configured to perform processing operations when in an on-mode and when powered by a supply voltage source, and an on-chip test capacitor switchably connected to the supply voltage source, where the on-chip test capacitor is configured to measure a drop in voltage across the DUT when the DUT is in a stop mode and is disconnected from the supply voltage. The IC also includes a current source configurable by a current-switch to couple to an on-chip circuit comprising the DUT and the on-chip test capacitor to provide for rapid discharge of the on-chip test capacitor when the on-chip test capacitor is isolated from the supply voltage source and when the DUT is in the stop mode.

Referring now to FIG. 1, a schematic block diagram of an integrated circuit test system for performing quiescent current measurement according to an embodiment of the present invention is shown. The system comprises a tester 100 having a voltage source for applying a positive supply voltage, Vdd, to an integrated circuit (IC) 150. The IC 150 in this embodiment comprises a System-on-Chip, but in alternative embodiments the circuitry provided on the single IC 150 could be distributed across two or more integrated circuits. The tester 100 provides the supply voltage Vdd to the IC 150 via a Vdd input pin 160 when a voltage supply switch 110 external to the IC 150, but connecting the tester 100 to the IC 150, is closed.

Also provided external to the IC 150 is a decoupling capacitor 120, connected between the positive supply voltage rail Vdd and ground. The decoupling capacitor 120 stores charge when connected to the tester 100 via the voltage supply switch 110 and can supply charge to the IC 150 when the tester 100 is disconnected from the IC 150.

In embodiments, switches such as the voltage supply switch 110 may be referred to as closed or on when in a conductive state and as open or off when in a non-conductive state. Any circuitry known in the art may be implemented to perform the switching function. The IC 150 comprises the Vdd input pin 160, processing circuitry shown as DUT 170, on-chip IDD self-test circuitry 180, and a switch control input pin 140 to control the on-chip IDD self-test circuit 180.

The DUT 170 can be any processing circuit undergoing testing, for example, a processor, a portion of a processor, a memory, a portion of a memory, a set of logic gates (a sea of gates or SOG), a digital signal processor, etc. In the described embodiments, the DUT 170 is a digital circuit, but quiescent current measurements could alternatively be performed on an analog DUT. Enable signals 130 from the DUT 170 provide control inputs to the on-chip IDD self-test circuitry 180.

The tester 100 comprises memory and a processor for executing test routines comprising a set of test vectors on the DUT 170 of the IC 150. The test vectors are selected to test for certain faults (e.g., resistive short) in the DUT 170 arising from a fabrication fault, which causes abnormal leakage. Only a small set of test vectors relative to a typical set of scan chain test vectors is required for the quiescent current measurements according to the present invention. In some embodiments the on-chip IDD self-test circuitry 180 is used in combination with scan chain circuitry implemented in the DUT 170 and the tester 100. Scan chain circuitry and the operation of scan circuitry in test modes in a DUT is well known in the art, so will not be described in detail here.

The on-chip IDD self-test circuitry 180 performs an on-chip measurement of quiescent current indirectly, by measuring a drop in voltage across the supply voltage rail Vdd in a predetermined time interval when the DUT 170 is disconnected from the voltage source and any clock signals driving the DUT 170 are frozen. This drop in supply voltage is used to determine whether or not a predicted maximum leakage current (based on the specific circuit design of the DUT 170) has been exceeded when the DUT 170 was operating in the quiescent state. The voltage drop (denoted as "delta voltage"—see FIG. 3) can be measured after the DUT 170 has had the power supply restored.

The DUT 170 may give rise to different types of quiescent current depending, for example, upon the kind of DUT (processor core, System on Chip, etc.). Example components of potential current sources in the DUT 170 are: (i) currents from a bandgap analog circuit; and (ii) currents from a power management controller (PMC) comprising the PMC analog circuit current and the PMC sourcing current to various digital blocks in the DUT. In some previously known systems bandgap currents can give rise to errors in the measurement of quiescent current of a DUT. In particular if a quiescent current measurement coincided with a bandgap-enablement point, a test could result in a false failure because the bandgap current has been inadvertently measured instead of the DUT leakage. According to the present invention, the stop Idd current can be a dynamic current and yet the measurement can still be reliably performed.

Figure 2:
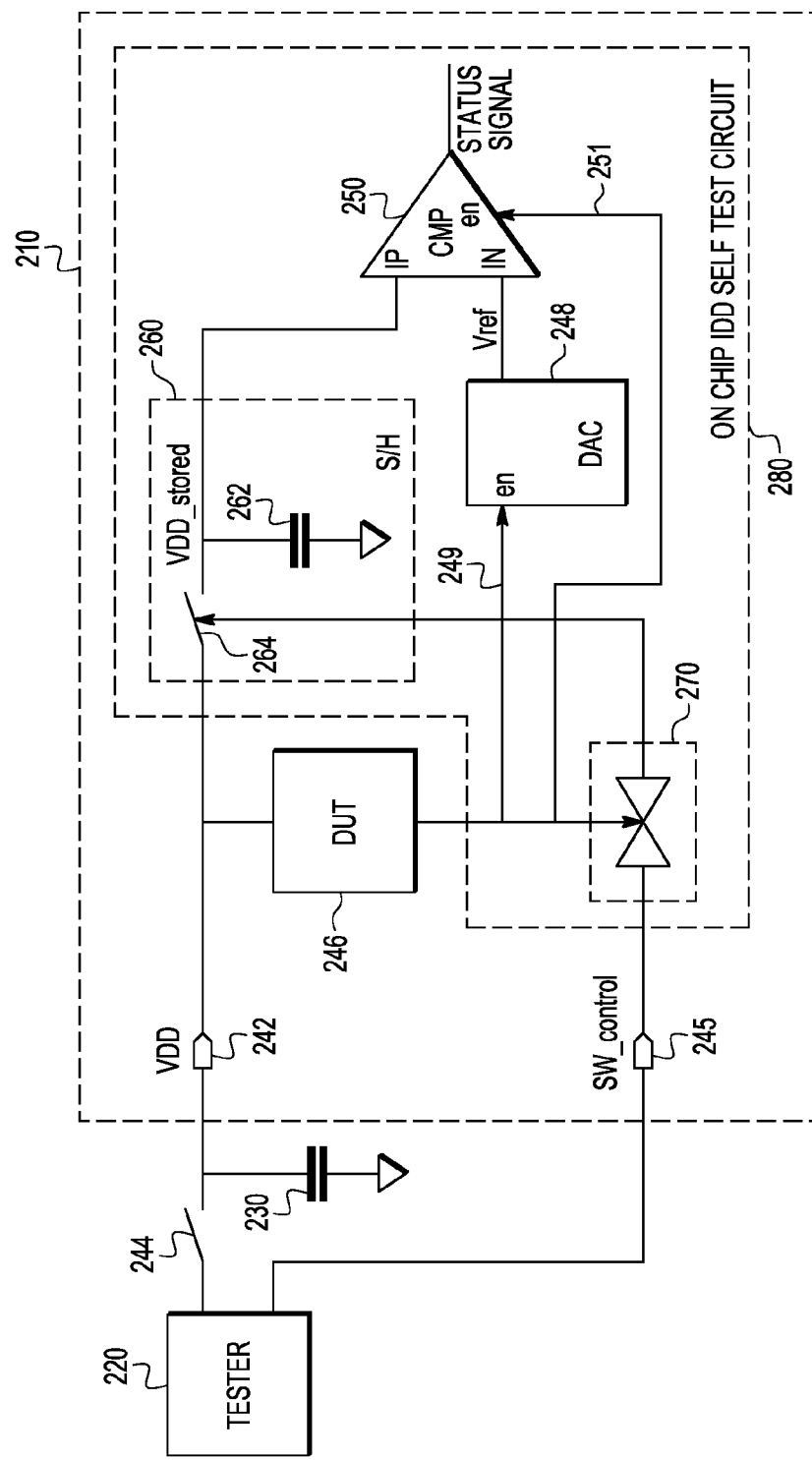
FIG. 2 is a schematic block diagram of a test function block of FIG. 1, according to an embodiment of the invention.

FIG. 2 is a schematic diagram of an integrated circuit 210 including on-chip IDD set test circuitry 280 in accordance with an embodiment of the present invention. In this embodiment, the IC 210 comprises an SOC. The SOC 210 is connected to a tester 220 and a decoupling capacitor 230. The tester 220 is configured for connection to a positive supply voltage Vdd input pin 242 of the SOC 210 via a voltage source switch 244 situated between the tester 220 and the Vdd input pin 242. The tester 220, as well as being configured to be switchably connected to the Vdd input pin 242 of the SOC 210, is connected to the SOC 210 via a switch control pin 245. The switch control pin 245 is used by the tester 220 to control the on-chip IDD test circuitry 280.

The on chip IDD test circuitry 280 includes a digital-to-analogue converter (DAC) 248 and a comparator 250. The comparator 250 may be implemented using an operational amplifier or op amp. The IDD test circuitry also includes dedicated internal test components comprising an internal Sample and Hold module 260 (S/H) and a multiplexer 270. The DUT 246 controls both the DAC 248 and the comparator 250 with respective enable signals 249 and 251, which are used to enable or disable the DAC 248 and the comparator 250.

The internal S/H module 260 comprises a capacitor 262, in this embodiment having a capacitance of about 5 pico-Farads (pF), and a self-test switch 264 for switchably connecting one plate of the capacitor 262 to the positive supply voltage (Vdd) input pin 242 of the SOC 210. The other plate of the capacitor 262 is connected to ground (or a negative supply voltage Vss).

The decoupling capacitor 230 is off-chip and serves as a temporary power supply when the tester 220 disconnects the power supply to the SOC 210 via the switch 244. Upon disconnection of the power supply, the voltage level will, after a period of time, drop to a certain level due to the current drawn by the DUT 246, and the voltage is measured by the on-chip IDD test circuitry 280 by comparison with a reference voltage. The switch control pin 245 provides a first input to the multiplexer 270 and a second input to the multiplexer is from the DUT 246. The output of the multiplexer 270 controls the self-test switch 264 of the S/H module 260, such that when the self-test switch 264 is closed, the self-test capacitor 262 is coupled to the supply voltage rail Vdd fed by the supply voltage pin 242. With the self-test switch 264 on (closed), the capacitor 262 will have the same voltage level as Vdd, which is supplied to the DUT 246, i.e., VDD_stored=Vdd.

The capacitor 262 also provides a positive (non-inverting) input to the comparator 250, which is compared with a reference voltage Vref supplied as a negative (inverting) input to the comparator 250. The reference voltage (Vref) is derived from a digital output of the DUT 246, converted to an analog voltage by the DAC 248, and fed to the comparator 250. When the self-test switch 264 is off, the supply voltage is disconnected from the S/H module 260, but still supplies the DUT 246. The voltage stored in the capacitor 262 is kept and later on is compared with the reference voltage Vref by the comparator 250, which generates a status signal to indicate whether the test has passed or failed, after VDD is re-connected to the tester supply.

The self-test switch 264 can be controlled either by the DUT 246 or the tester 220 depending upon the control input to the multiplexer 270. When the multiplexer 270 is switched on such that the tester 220 controls the self-test switch 264, the comparator 250 outputs the status signal based upon a comparison of the reference voltage Vref and a voltage stored in the capacitor 262 (denoted "Vdd_stored").

Figure 3:
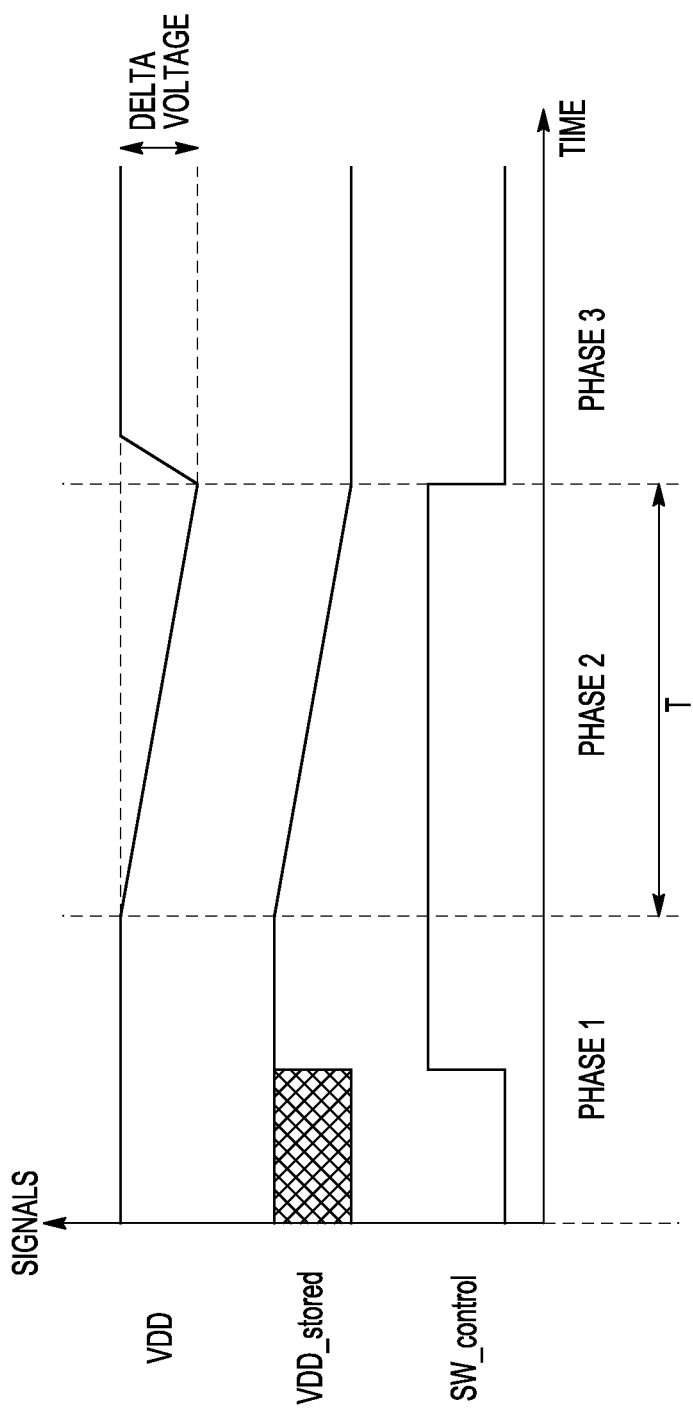
FIG. 3 is a timing chart that illustrates a control timing sequence for the test function block of FIG. 2.

FIG. 3 is a schematic diagram illustrating control timing for the test circuitry 280 of FIG. 2 for performing a quiescent current (or "STOP IDD") test. The control timing covers three distinct phases of the test procedure. FIG. 3 shows in the uppermost graph a plot of the value of the positive supply voltage Vdd at the Vdd input pin 242 as a function of time across the three phases. This also corresponds to the voltage across the DUT 246. The middle graph shows the voltage across the capacitor 262 as a function of time across the three phases. The lowermost graph of FIG. 3 shows the value of the switch control input to the switch control pin 245, which controls the multiplexer 270. The lowermost graph provides an indication of whether or not the self-test switch 264 is closed.

In phase one of the control timing, the tester 220 switches power on (closes voltage source switch 244) and supplies Vdd to the Vdd input pin 242. Initially, in phase one, the on-chip IDD test circuit 280 is disabled by opening the self-test switch 264. Furthermore, the DAC 248 and comparator 250 are each disabled by the DUT 246 via inputs 249 and 251 respectively. With the power on and the DUT 246 functioning, the tester 220 controls the multiplexer 270 to close the self-test switch 264 to enable the internal test process of charge storage on the self-test capacitor 262. With the self-test switch 264 on, the self-test capacitor 264 charges up because it is connected to the supply voltage Vdd.

When the self-test switch 264 and the voltage source switch 244 are both closed, the decoupling capacitor 230 is connected in parallel with the self-test capacitor 262 and both of these capacitors are connected in parallel with the DUT 246, which is in a clocked state with the supply voltage on. The DUT 246 will have an associated effective capacitance and an effective current.

When the voltage source switch 244 is opened, which occurs throughout phase two, the DUT 246 has its clock signal(s) frozen and enters a quiescent state. However, even in the quiescent state, the DUT 246 is still expected to draw a current (small relative to the current drawn in the switching state) on the order of several μA due to leakage. This means that the DUT 246 will draw charge from the decoupling capacitor 230 when the voltage source switch 244 is open.

In FIG. 3, the charge stored on the self-test capacitor 262 of the S/H module 260 is denoted VDD_stored. The hashed area in the VDD_stored graph represents an uncharged self-test capacitor 262 prior to the time in Phase one when the self-test switch 264 is closed. As shown in FIG. 3, when the self-test switch 264 is on, as controlled by the switch control pin 245, the value of VDD_stored rises rapidly and stabilises to match the supply voltage VDD. The step change from low to high in the switch control signal of the lowermost graph in FIG. 3 indicates that the multiplexer 270 has been controlled to close the self-test switch 264 to begin charging of the capacitor 262, part way through the Phase one stage.

Phase two of the control timing is triggered when the VDD input pin 242 is cut off from the tester 220. When this happens, both the supply voltage VDD and VDD_stored drop linearly towards zero as time advances. The rate of change in the voltage will depend upon the capacitances of the decoupling capacitor 230 and the self-test capacitor 262 and the quiescent current drawn by the DUT 246. When the supply voltage is cut off from the tester 220 at the beginning of Phase two, charge is drawn from both the decoupling capacitor 230 and the self-test capacitor 262, delaying the fall in VDD. Phase two of the control timing is maintained for a duration corresponding to test time T.

The beginning of Phase three of the control timing coincides with the VDD input pin 242 of the integrated circuit 210 being re-connected with the tester 220 (i.e., the voltage source switch 244 is closed). Thus, as shown in FIG. 3, VDD rises substantially linearly to the Phase one value during Phase three. At the beginning of Phase 3, the switch control signal switches the multiplexer 270 off, opening the self-test switch 264. Vdd_stored will remain at substantially the same level when the self-test switch 264 is open because the current drawn from the self-test capacitor 262 can be ignored when the switch 264 is open.

In Phase three, the DAC 248 and the comparator 250 are enabled by the DUT 246 and a comparison is performed between a reference voltage VREF and the residual voltage across the self-test capacitor 262. The reference voltage VREF is pre-selected, e.g., VDD−0.3V, or if the off-chip decoupling capacitor 230 and the value of T (see FIG. 3) is known, Vref=VDD−(Idd_max*T)/C, where Idd_max is the specification maximum IDD, T is the Phase 2 discharge time and C is the sum of off-chip decoupling capacitor 230. If the voltage of the self-test capacitor 262 as measured during phase three (i.e., VDD_stored) exceeds VREF then the test is passed, verifying that the leakage current within the DUT 246 is within an acceptable tolerance for resilience of the MCU to failure.

The test time T for phase 2 of the control timing is calculated according to the formula:

$$T = \frac{C*(VDD - Vref)}{Idd\_max} \qquad \text{equation 1}$$

Where C is the capacitance of the decoupling capacitor 230 in Farads, VDD is the positive supply voltage of the tester 220 power supply in volts, VREF is the reference voltage in volts determined by the DUT 246 and supplied to the inverting input of the comparator 250. The reference voltage for the stop IDD test in this embodiments is VDD−0.3 V. Idd_max is the maximum "stop IDD current" (quiescent current) according to the characteristics of the particular DUT 246. In some embodiments the quiescent current is in the region of two micro-Amps.

Thus, for a given VDD and VREF and a characteristic Idd_max, the capacitance of the decoupling capacitor 230 determines the test time T. For example, in this embodiment Idd_max=1.5 µA, (VDD−VREF)=0.3V and C=0.1 µF, so T=(0.1*10$^{-6}$*0.3)/(1.5*10$^{-6}$)=0.02 s=20 ms. If the capacitance of the decoupling capacitor is decreased to 1 nF then the test time T decreases to 0.2 ms whereas if the capacitance of the decoupling capacitor 230 increases to 1 µF then the test time T increases to 0.2 seconds. A reduced test time provides for a more efficient test procedure. In the embodiment of FIG. 2, 10 to 20 milliseconds is an appropriate power off duration T due to the expected behaviour of the Power Management Controller (bandgap enable/disable with 1 ms cycle) of the DUT 246.

Providing the on-chip IDD self-test circuitry including 262, 264, 270 and the comparator circuitry 248, 250 allows an indirect measurement in quiescent current to be performed via measurement of the delta voltage (see FIG. 3) in a shorter time than would be required to measure the quiescent current using an ammeter and waiting for the processing circuitry of the DUT to settle deeply into a stop mode. The value of IDD_max in the above equation should be the allowable maximum stop current (i.e, the chip is already in stop mode).

Figure 4:
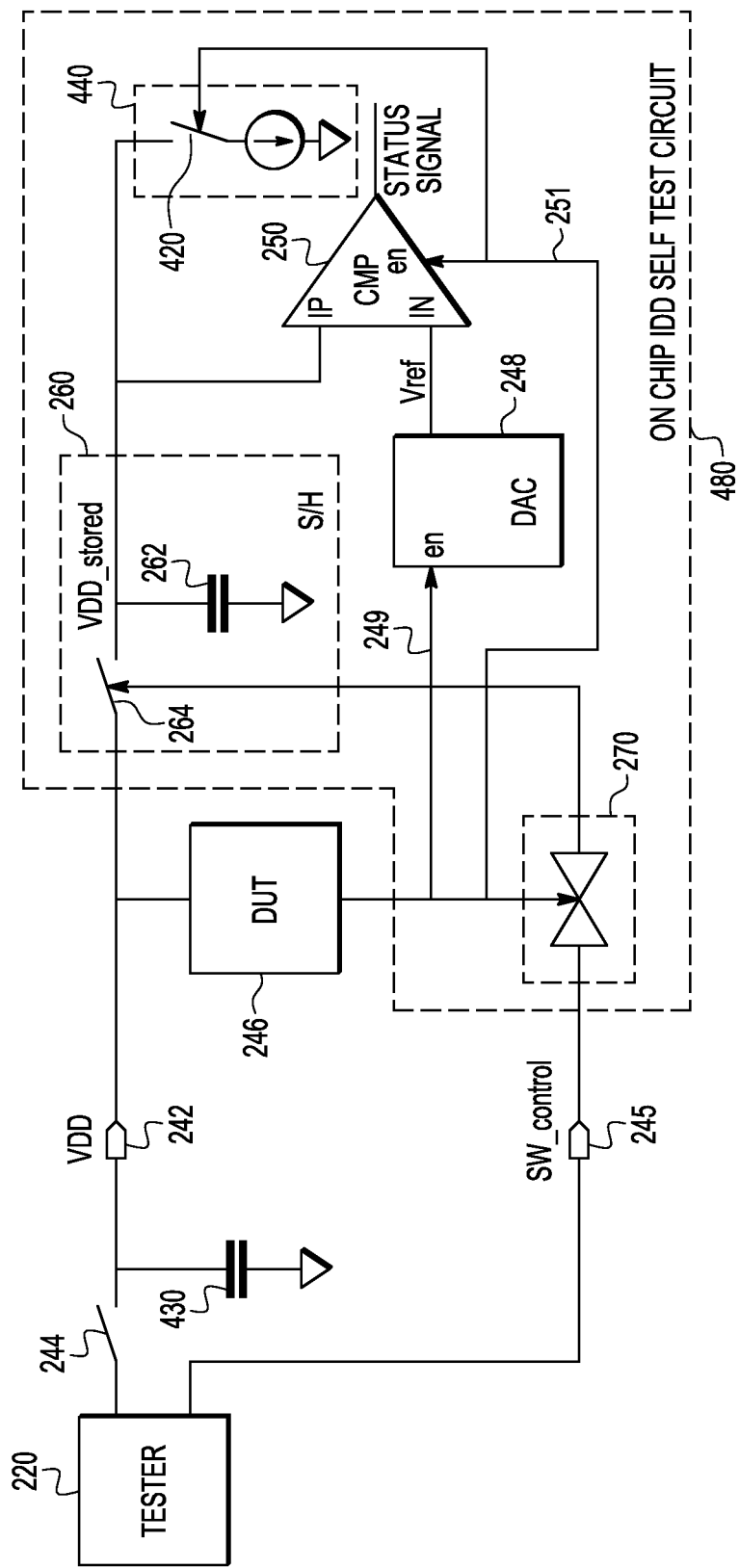
FIG. 4 is a schematic block diagram of a test function block with a programmable current source according to a second embodiment of the present invention.

FIG. 4 schematically illustrates a second embodiment of a test function block according to the present invention. The arrangement is similar to the embodiment shown in FIG. 2, with identical components performing the same or similar functions as described above with reference to FIG. 3. However, in FIG. 4, the decoupling capacitor 430 has a larger capacitance than the capacitor 230 (0.1 µF) shown in FIG. 2. In particular, the decoupling capacitor 430 has a capacitance of 1 µF. Note that although for test purposes the larger decoupling capacitance is not particularly desirable, there are likely to be circuit arrangements where the decoupling capacitance is already large, so in this case the test can be made more efficient (speeded up) by providing an additional programmable current source. Thus, according to equation 1, with Idd_max=1.5 µA, VDD−VREF=0.3V and C=1 µF, the test period T=0.2 s.

To reduce this test time, for a fixed capacitance and fixed VDD and Vref, the current can be increased, as shown in FIG. 4 by adding a current source 440 to speed up discharge of the decoupling capacitor 430. A current switch 420 is provided to switchably couple and decouple the current source 440 from an on-chip circuit comprising the DUT 246 (i.e., the MCU) and the on-chip capacitor 262. The on-chip capacitor 262 has an associated switch controlled by the multiplexer 270. Thus, the self-test switch 264 can be selectively controlled by either the DUT 246 or the tester 220. The current switch 420 can also be controlled by either the DUT 246 or the tester 220. The current switch 420 can, in some embodiments, be controlled independently of the self-test switch 264 and the off-chip voltage source switch 244. The current source 440 is used to achieve more rapid discharge of the decoupling capacitor 430 (it also discharges the on-chip capacitor 262). The current source 440 is switched on when both the DUT 246 is in the stop mode and when the DUT 246 is isolated from the supply voltage source. Although the DUT 246 enters stop mode during Phase 1 (see FIG. 3), the DUT 246 is not isolated from the supply voltage until the beginning of Phase 2. The current source 440 is switched off again before the on-chip capacitor 262 is isolated from the supply voltage rail of the DUT 246 at the beginning of Phase 3 (see FIG. 3) so that the voltage change stored in the S/H module 260 is stored for comparison with the reference voltage Vref output by the DAC 248. Thus, the current source 440 remains on for the test period T of Phase 2. In the preferred embodiment, the current source 440 is programmable to generate a known, substantially constant current, which allows the test time T to be derived from the following equation:

$$T = \frac{C*(VDD - Vref)}{\text{Idd\_max} + \text{Iadded}} \qquad \text{equation 2}$$

Where Iadded is obtained from the known current of the current source 440. For Iadded=3 µA and C=1 µF, equation 2 gives T=66 ms, which is considerably shorter than the 0.2 s test period for a capacitance of C=1 µF according to equation 1. However, it should be noted that the reduced test period afforded by inclusion of the current source 440 may result in an additional 5%-20% tolerance in Idd_max due to mismatching. Further, inclusion of the current source increases circuit area relative to the arrangement shown in FIG. 2. In FIG. 4, the circuit 480 is useful for circuits where there is a relatively large decoupling capacitor already attached to the supply on the board (e.g., 1 uF or 10 uF, which is much larger than one example desired value like 0.1 uF). If there is a pre-existing large decoupling capacitor, if there is no additional current source like the current source 440, then the discharge time T will be very long, or the voltage drop will be very small in comparison to the FIG. 2 voltage drop, which could give rise to a less accurate comparison being performed by the comparator 251.

Figure 5:
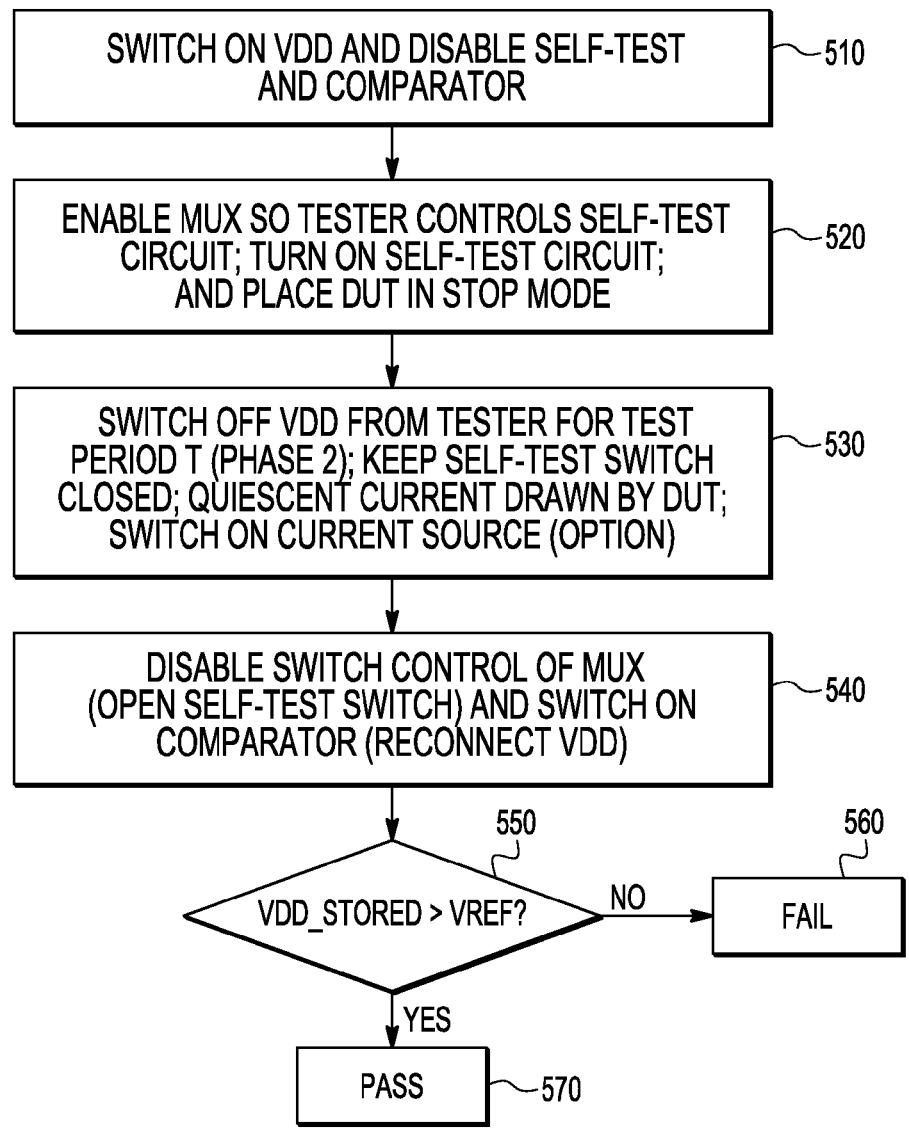
FIG. 5 is a flow chart illustrating the control timing of the quiescent current measurement performed in the test function blocks of FIGS. 2 and 4.

FIG. 5 is a flow chart of method for obtaining a quiescent current measurement using IDD on-chip test circuitry according to the present invention.

The method begins at step 510, where a voltage source is applied to the Vdd pin 242 (FIG. 2) of the integrated circuit by closing the power supply switch 244. At this stage, although the DUT 246 is supplied with power and the DUT 246 is in an on-mode in which it is capable of performing processing, the IDD on-chip Idd test circuit 280, including S/H module 260 and the comparator circuitry 248, 250 are both disabled.

Next, at step 520, the multiplexer 270 is enabled via a signal from the DUT 246, allowing the tester 220 to control the self-test switch 264 to switch on. This occurs during Phase 1 of the graph of FIG. 3. With the self-test switch 264 switched on and the power source connected to the Vdd input pin 242, the self-test capacitor 262 stores charge. The decoupling capacitor 230 also stores charge and the DUT 246 is put into a stop mode (note that the stop mode transition of the DUT 246 occurs in Phase 1 rather than in Phase 2), in which any clock signals driving processing in the DUT 246 are frozen and the supply voltage has been gated.

With the self-test switch 264 still switched on, at step 530, the power switch 244 is opened, cutting off power from the Vdd input pin 242. This corresponds to the beginning of Phase 2 in FIG. 3. The power switch 244 is kept open for a test period T, with the self-test switch 264 still in an on-state. The end of the test period T coincides with the power supply being reconnected to the Vdd input pin 242. The self-test switch 264 is opened (swtiched off) at the beginning of Phase 3. Note that the self-test switch 264 is switched on part way through Phase 1 and remains on throughout Phase 2 until the beginning of Phase 3. Thus the self-test switch 264 remains on for a duration longer than the test period T.

During the time period T (spanning Phase 2), charge that was stored on the decoupling capacitor 230 when the power supply was connected via the switch 244 in Phase 1 is discharged through the DUT 246. The static current drawn by the on-chip IDD test circuit 280 can be ignored because the circuit 280 is connected to the op_amp 250 input. At this point, as mentioned above, the circuitry in the DUT 246 is not switching, but is controlled by the tester 220 to be in a quiescent state. Accordingly, any current drawn from the decoupling capacitor 230 by the DUT 246 should correspond to leakage current, unless there is a manufacturing defect in the DUT 246. Due to the parallel connection, the voltage, Vdd_stored, stored in the self-test capacitor 262 should match the supply voltage Vdd. The linear decline in Vdd in Phase 2 is due to the decoupling capacitor 230 discharging. During the period covered by step 530, the charge stored in the self-test capacitor 262 (VDD_stored in FIG. 3) falls due to the quiescent current being drawn by the DUT 246 during the time when the voltage source is disconnected.

In the embodiment of FIG. 4, where the programmable current source 440 is provided as part of the on-chip test circuit 480 to enable the self-test capacitor 262 to discharge more rapidly when quiescent current of the DUT 246 is being drawn and the voltage source is disconnected, the current switch 420 can be controlled by the off-chip tester 220 and need only be switched on during the test time T corresponding to Phase 2 of FIG. 3 to have the required effect of reducing the on-chip capacitor 262 discharge time. However, in alternative embodiments, the current switch 420 can be controlled to couple and decouple the current source 440 as required under the control of at least one of the tester 220 and the DUT 246. Thus in some embodiments, the current source 440 will be switched on at the stage of FIG. 5 corresponding to step 530.

At step 540, first the self-test switch 264 is opened and then the power switch 244 is closed reconnecting the voltage source to the Vdd input pin 242. Although the self-test switch 264 is open, charge is still retained on the self-test capacitor 262. Next, the DUT 246 sends a signal to enable the comparator circuitry 248, 250 so that stored voltage from the self-test capacitor 262 is supplied as one input to the comparator circuitry for comparison with a predetermined reference voltage.

At step 550, the value of Vdd_stored is compared with the reference voltage. If Vdd_stored>Vref then the test is passed, but if Vdd_stored≤Vref the test fails, indicating a defect has been detected in the DUT 246. Thus measurement of the delta voltage provides an indirect on-chip measurement of quiescent current of the DUT 246.

It will be appreciated that embodiments can be realized in the form of hardware, software or a combination of hardware and software. Any such software may be stored in the form of volatile or non-volatile storage, for example a storage device like a ROM, whether erasable or rewritable or not, or in the form of memory, for example RAM, memory chips, device or integrated circuits or on an optically or magnetically readable medium, for example a CD, DVD, magnetic disk or magnetic tape or the like. It will be appreciated that the storage devices and storage media are embodiments of machine-readable storage that are suitable for storing a program or programs comprising instructions that, when executed, implement embodiments of the present invention.

Accordingly, embodiments provide a program comprising code for implementing apparatus or a method as claimed in any one of the claims of this specification and a machine-readable storage storing such a program. Still further, such programs may be conveyed electronically via any medium, for example a communication signal carried over a wired or wireless connection and embodiments suitably encompass the same.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An integrated circuit, comprising:
    a supply voltage input pin configured for connection to an external test unit to receive a supply voltage;
    processing circuitry configured to perform processing operations controlled by a clock signal and powered by the supply voltage; and
    an on-chip test circuit for testing operation of the processing circuitry, wherein the on-chip test circuit measures a voltage change across the processing circuitry during a predetermined test period T when the processing circuitry is isolated from the supply voltage and the clock signal is stopped, wherein the voltage change provides an indication of quiescent current corresponding to the processing circuitry, and wherein the on-chip test circuit includes a self-test capacitor connected to a supply voltage rail fed by the supply voltage input pin.

2. The integrated circuit of claim 1, wherein the on-chip test circuit includes a self-test switch that, in an on-state, allows charge to flow to the self-test capacitor, and in an off-state, isolates the self-test capacitor from the supply voltage rail.

3. The integrated circuit of claim 2, further comprising a decoupling capacitor connected to the supply voltage pin, wherein upon isolation of the processing circuitry from the supply voltage, the decoupling capacitor discharges through the processing circuitry.

4. The integrated circuit of claim 3, wherein the self-test capacitor is connected in parallel to the processing circuitry across the decoupling capacitor when the self-test switch is in the on-state.

5. The integrated circuit of claim 4, wherein the predetermined test time T depends upon a capacitance of the decoupling capacitor, the supply voltage applied to the supply voltage pin, a predetermined reference voltage and a predetermined maximum permissible leakage current for the processing circuitry.

6. The integrated circuit of claim 3, wherein the on-chip test circuit includes a current source that supplies a known current across the processing circuitry when the supply voltage pin is isolated from the supply voltage.

7. The integrated circuit of claim 6, wherein the current source comprises a current switch controlled by at least one of the processing circuitry and the external test unit, wherein the current switch is in an on-state when coupling the current source to the processing circuitry and an off-state when decoupling the current source from the processing circuitry.

8. The integrated circuit of claim 7, wherein the current source, when coupled to the processing circuitry, allows the decoupling capacitor to discharge at a faster rate relative to a discharge rate when the current source is decoupled from the processing circuitry, to thereby speed up test time.

9. The integrated circuit of claim 8, wherein the current source is programmable via at least one of the processing circuitry and the external test unit to provide a DC current value for the predetermined test time T depending on a capacitance of the decoupling capacitor, the supply voltage applied to the supply voltage pin, and a predetermined maximum permissible leakage current for the processing circuitry.

10. The integrated circuit of claim 2, wherein the on-chip test circuit includes a multiplexer configurable by at least one of the processing circuitry and the external test unit to control the self-test switch.

11. The integrated circuit of claim 10, wherein the on-chip circuit includes a comparator that compares a voltage across the self-test capacitor when the self-test capacitor is isolated from the supply voltage rail to a reference voltage and outputs a status signal indicative of a test result for the testing of the processing circuitry.

12. The integrated circuit of claim 11, wherein the processing circuitry outputs an enable signal for controlling at least one of the multiplexer and the comparator.

13. The integrated circuit of claim 12, wherein the comparator comprises at least one of a digital-to-analog converter and an operational amplifier.

14. A method of testing an integrated circuit comprising processing circuitry configured to perform processing operations controlled by a clock signal and powered by a supply voltage, the method comprising:
 connecting the supply voltage to the integrated circuit;
 connecting the supply voltage to an on-chip test capacitor;
 putting the processing circuitry in a stop mode and isolating the processing circuitry from the supply voltage;
 waiting a predetermined test period T, holding charge stored in the on-chip test capacitor of the integrated circuit;
 disconnecting the on-chip test capacitor from the supply voltage of the processing circuitry;
 re-connecting the supply voltage to the processing circuitry; and
 measuring a voltage change across the processing circuitry during the test period T based upon the stored charge in the on-chip test capacitor.

15. An integrated circuit, comprising:
 a Device Under Test (DUT) configured to perform processing operations when in an on-mode and powered by a supply voltage source;
 an on-chip test capacitor switchably connected to the supply voltage source, wherein the on-chip test capacitor measures a drop in voltage across the DUT when the DUT is in a stop mode and is disconnected from the supply voltage source; and
 a current source configurable by a current-switch to couple to an on-chip circuit comprising the DUT and the on-chip test capacitor to provide for rapid discharge of the decoupling capacitor when the DUT test is isolated from the supply voltage.

16. The integrated circuit of claim 15, wherein the current source is programmable by at least one of the DUT and an off-chip tester to provide a DC current source for a predetermined test time T.

17. The integrated circuit of claim 16, wherein the predetermined test time, T, corresponds to a time period starting with the supply voltage source being isolated from the DUT and ending with the supply voltage being reconnected to the DUT.

18. The integrated circuit of claim 16, further comprising:
 an on-chip capacitor switch for switching the on-chip capacitor on and off; and
 a multiplexer allowing selective control of the on-chip capacitor switch by one of the DUT and an off-chip tester.

19. The integrated circuit of claim 16, further comprising a supply voltage pin switchably connected to the supply voltage source enabling the DUT to be selectively connected to and disconnected from the supply voltage source.

* * * * *